United States Patent
Ahmad et al.

(10) Patent No.: US 8,574,671 B2
(45) Date of Patent: Nov. 5, 2013

(54) METHOD FOR ADJUSTING THE COOLANT CONSUMPTION WITHIN ACTIVELY COOLED COMPONENTS, AND COMPONENT

(75) Inventors: Fathi Ahmad, Kaarst (DE); Knut Haberstadt, Mülheim an der Ruhr (DE); Christian Lerner, Dorsten (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/351,259

(22) Filed: Jan. 17, 2012

(65) Prior Publication Data

US 2012/0251741 A1    Oct. 4, 2012

(30) Foreign Application Priority Data

Jan. 18, 2011  (EP) ..................................... 11151286

(51) Int. Cl.
  *B05D 7/22*   (2006.01)
  *C23C 16/00*  (2006.01)

(52) U.S. Cl.
  USPC ...................... 427/237; 427/248.1

(58) Field of Classification Search
  USPC .............................. 427/237, 248.1
  See application file for complete search history.

(56) References Cited

U.S. PATENT DOCUMENTS

| | | |
|---|---|---|
| 5,928,725 A | 7/1999 | Howard |
| 6,024,792 A | 2/2000 | Bieler |
| 2003/0007870 A1 | 1/2003 | Fink et al. |
| 2006/0263217 A1 | 11/2006 | Spanks, Jr. |
| 2008/0057193 A1 * | 3/2008 | Mantkowski .................. 427/237 |
| 2009/0317658 A1 * | 12/2009 | Narita ............................ 428/650 |

FOREIGN PATENT DOCUMENTS

| | | |
|---|---|---|
| EP | 0486489 B1 | 11/1994 |
| EP | 0412397 B1 | 3/1998 |
| EP | 0892090 A1 | 1/1999 |
| EP | 0786017 B1 | 3/1999 |
| EP | 1306454 A1 | 5/2003 |
| EP | 1319729 A1 | 6/2003 |
| EP | 1361338 A1 | 11/2003 |
| EP | 1204776 B1 | 6/2004 |
| EP | 1672089 A1 | 6/2006 |
| WO | WO 9967435 A1 | 12/1999 |
| WO | WO 0044949 A1 | 8/2000 |

* cited by examiner

*Primary Examiner* — Kelly M Gambetta

(57) ABSTRACT

A method for adjusting the coolant consumption within actively cooled components is produced. The components include an interior with at least one duct with different regions which have different cross sections of flow. A greater increase in the wall thickness is produced in the region having the smaller cross section of flow by a first diffusion process and a lesser increase in the wall thickness is produced in the region having the larger cross section of flow by a second diffusion process which is different from the first. By using different diffusion coatings in a component, it is possible to adjust the flow of coolant through a component in a controlled way.

7 Claims, 4 Drawing Sheets

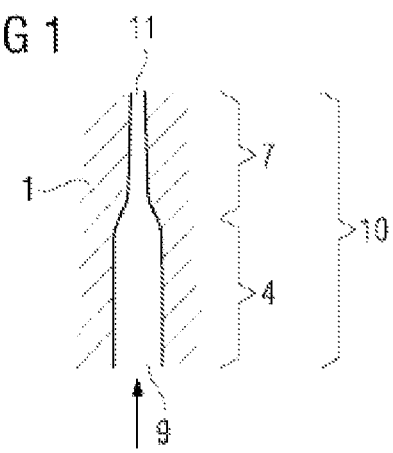
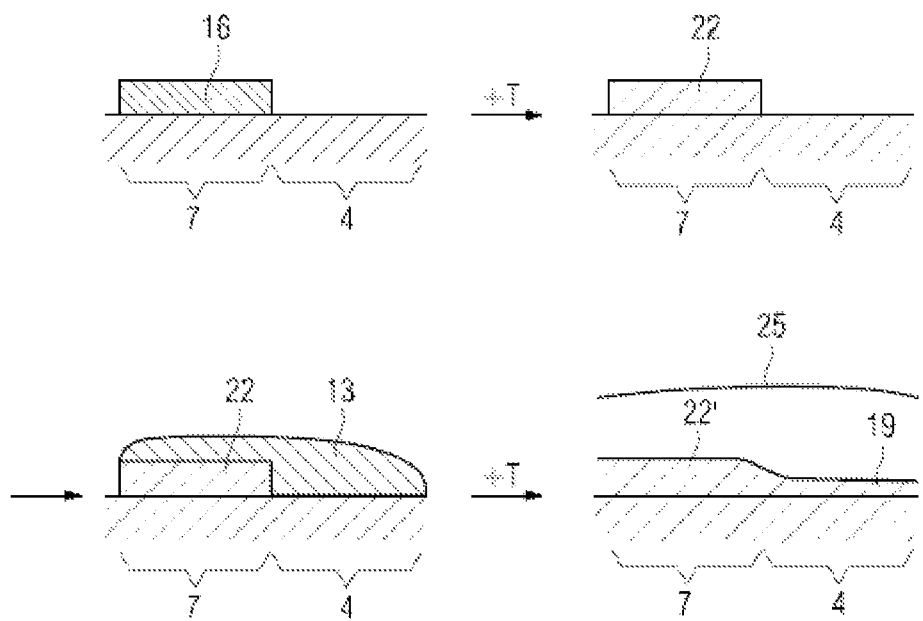

FIG 6

| Material | Chemical composition in % | | | | | | | | | | | | |
|---|---|---|---|---|---|---|---|---|---|---|---|---|---|
| | C | Cr | Ni | Co | Mo | W | Ta | Nb | Al | Ti | B | Zr | Hf |
| Ni-base investment casting alloys | | | | | | | | | | | | | |
| GTD 222 | 0.10 | 22.5 | Rest | 19.0 | | 2.0 | 1.0 | | 1.2 | 2.3 | 0.008 | 0.008 | |
| IN 939 | 0.15 | 22.4 | Rest | 19.0 | | 2.0 | 1.4 | 1.0 | 1.9 | 3.7 | 0.009 | 0.10 | |
| IN 6203 DS | 0.15 | 22.0 | Rest | 19.0 | | 2.0 | 1.1 | 0.8 | 2.3 | 3.5 | 0.010 | 0.10 | 0.75 |
| Udimet 500 | 0.10 | 18.0 | Rest | 18.5 | 4.0 | | | | 2.9 | 2.9 | 0.008 | 0.05 | |
| IN 738 LC | 0.10 | 16.0 | Rest | 8.5 | 1.7 | 2.6 | 1.7 | 0.9 | 3.4 | 3.4 | 0.010 | 0.10 | |
| SC 16 | <0.01 | 16.0 | Rest | | 3.0 | | 3.5 | | 3.5 | 3.5 | <0.005 | <0.005 | |
| Rene 80 | 0.17 | 14.0 | Rest | 9.5 | 4.0 | 4.0 | | | 3.0 | 5.0 | 0.015 | 0.03 | |
| GTD 111 | 0.10 | 14.0 | Rest | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Rest | 9.0 | 1.9 | 4.1 | 4.1 | | 3.4 | 3.8 | 0.015 | 0.02 | |
| IN 792 DS | 0.08 | 12.5 | Rest | 9.0 | 1.9 | 4.1 | 4.1 | | 3.4 | 3.8 | 0.015 | 0.02 | 1.00 |
| MAR M 002 | 0.15 | 9.0 | Rest | 10.0 | | 10.0 | 2.5 | | 5.5 | 1.5 | 0.015 | 0.05 | 1.50 |
| MAR M 247 LC DS | 0.07 | 8.1 | Rest | 9.2 | 0.5 | 9.5 | 3.2 | | 5.6 | 0.7 | 0.015 | 0.02 | 1.40 |
| CMSX-2 | <0.005 | 8.0 | Rest | 4.6 | 0.6 | 8.0 | 6.0 | | 5.6 | 1.0 | <0.005 | <0.005 | 0.10 |
| CMSX-3 | <0.005 | 8.0 | Rest | 4.6 | 0.6 | 8.0 | 6.0 | | 5.6 | 1.0 | <0.005 | <0.005 | 0.10 |
| CMSX-4 | | 6.0 | Rest | 10.0 | 0.6 | 6.0 | 6.0 | | 5.6 | 1.0 | | Re=3.0 | |
| CMSX-6 | <0.015 | 10.0 | Rest | 5.0 | 3.0 | <.10 | 2.0 | <.10 | 4.9 | 4.8 | <0.005 | <0.005 | 0.10 |
| PWA 1480 SX | <0.005 | 10.0 | Rest | 5.0 | | 4.0 | 12.0 | | 5.0 | 1.5 | <0.005 | <0.005 | |
| PWA 1483 SX | 0.07 | 12.2 | Rest | 9.0 | 1.9 | 3.8 | 5.0 | | 3.6 | 4.2 | 0.0001 | 0.002 | |
| Co-base investment casting alloys | | | | | | | | | | | | | |
| FSX 414 | 0.25 | 29.0 | 10 | Rest | | 7.5 | | | | | 0.010 | | |
| X 45 | 0.25 | 25.0 | 10 | Rest | | 8.0 | | | | | 0.010 | | |
| ECY 768 | 0.60 | 24.0 | 10 | 51.7 | | 7.5 | 4.0 | | 0.20 | 0.3 | 0.010 | 0.05 | |
| MAR-M-509 | 0.60 | 24.5 | 11 | Rest | | 7.5 | 4 | | | 0.3 | 0.010 | 0.60 | |
| CM 247 | 0.07 | 8.3 | Rest | 10.0 | 0.5 | 9.5 | 3.2 | | 5.5 | 0.7 | 0.002 | | 1.5 |

METHOD FOR ADJUSTING THE COOLANT CONSUMPTION WITHIN ACTIVELY COOLED COMPONENTS, AND COMPONENT

CROSS REFERENCE TO RELATED APPLICATIONS

This application claims priority of European Patent Office application No. 11151286.9 EP filed Jan. 18, 2011. All of the applications are incorporated by reference herein in their entirety.

FIELD OF INVENTION

The invention relates to a method for adjusting the coolant consumption within actively cooled components, and to a component.

BACKGROUND OF INVENTION

Components which are used at high temperatures, such as for example turbine blades or vanes in gas turbines, have active cooling, wherein a coolant is introduced into the interior, runs through coolant ducts through the turbine blades or vanes and if appropriate emerges through film cooling holes.

It is important that the turbine blades or vanes should not be excessively cooled, since this would greatly increase the coolant consumption, which would reduce the efficiency of the turbine because the cooling air is mostly taken from the compressor.

It is therefore important for the coolant consumption to be adjusted by optimally adjusting the throughflow rate.

SUMMARY OF INVENTION

The object is achieved by a method and a component as claimed in the claims.

The dependent claims list further advantageous measures which can be combined with one another, as desired, in order to obtain further advantages.

BRIEF DESCRIPTION OF THE DRAWINGS

FIGS. 1, 2, 3 show diagrammatic illustrations of the invention,
FIG. 6 shows a list of superalloys.
The figures and the description represent only exemplary embodiments of the invention.

DETAILED DESCRIPTION OF INVENTION

Figure 3:
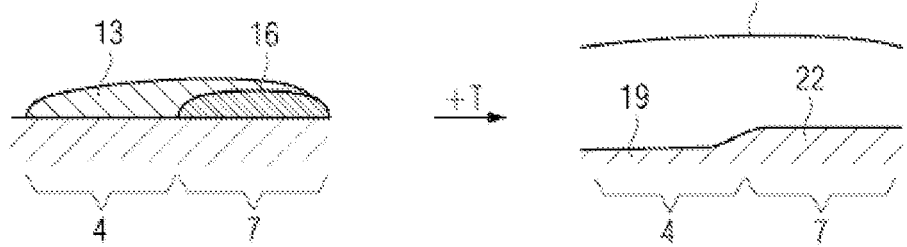

FIG. 1 diagrammatically depicts at least part of an inner duct 10 of a hollow component 1.

The duct 10 is in particular a cooling duct 10 and is divided into various regions, in this case preferably into two regions 4 and 7, which initially have a larger cross section at the entrance 9 than at the exit 11.

Accordingly, there are regions 4, 7 of different cross sections of flow.

The regions 4, 7 do not necessarily lie at the entrance 9 or at the exit 11.

Figure 4:
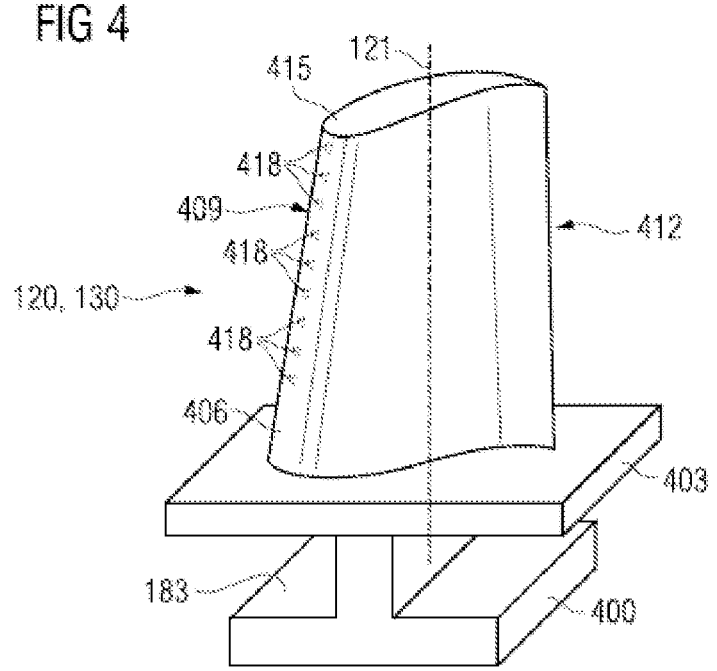
FIG. 4 shows a turbine blade or vane

In the case of a turbine blade or vane, the entrance 9 is preferably located in the region of the root 400 (FIG. 4) and the exit 11 is preferably located in the region of the trailing edge 412 (FIG. 4).

The component 1, 120, 130 may have a plurality of cooling ducts or more than two regions.

The invention proposes that the various regions 4, 7 be provided with diffusion coatings, which lead to thickening and therefore to a narrowing of the bore of the cooling duct 10 at various regions 4, 7.

FIG. 2 shows a first such process.

Here, a diffusion coating 22 is produced only in the first region 7 having the smaller cross section by a first diffusion coating process using a first coating material 16, leading to a thickening of the wall (+T).

In a second step, another coating material 13 is applied in the first region 7 and in the second region 4, in order to produce a diffusion coating in the region 4 as well, which leads to a second diffusion coating 19 in the second region 4. In particular on account of a different coating process resulting from the further coating material 16, a greater wall thickening occurs in the region 7 of smaller cross section than in the first diffusion coating process. As a result, the layer region 22 is also changed and a thicker layer region 22' is formed.

The material 16 may correspond to or differ from the material 13 of the second coating process.

The diffusion coatings 19 and 22' preferably form one continuous diffusion coating 25.

For the regions 4, 7 this is preferably an aluminizing process, which for the region 4 of larger cross section preferably uses NiAl for the diffusion coating process and/or for the region 7 of smaller cross section uses $Ni_2Al_3$ for the diffusion coating, the activation temperature being lower for $Ni_2Al_3$.

The two coating processes can also be used simultaneously, as illustrated in FIG. 3.

The coating material 16 is present in the region 7 having the smaller cross section.

The coating material 13 is present in the region 4 having the larger cross section.

Preferably, the material 13 is also present on top of the material 16.

It is preferable first of all to increase the temperature to the temperature required for the first diffusion coating process and then to increase the temperature directly to the temperature required for the second diffusion coating process.

The diffusion coatings 19 and 22 preferably form one continuous diffusion coating 25.

Preferably, the entire inner region of the turbine blade or vane 120, 130 is coated, in particular aluminized.

Figure 5:
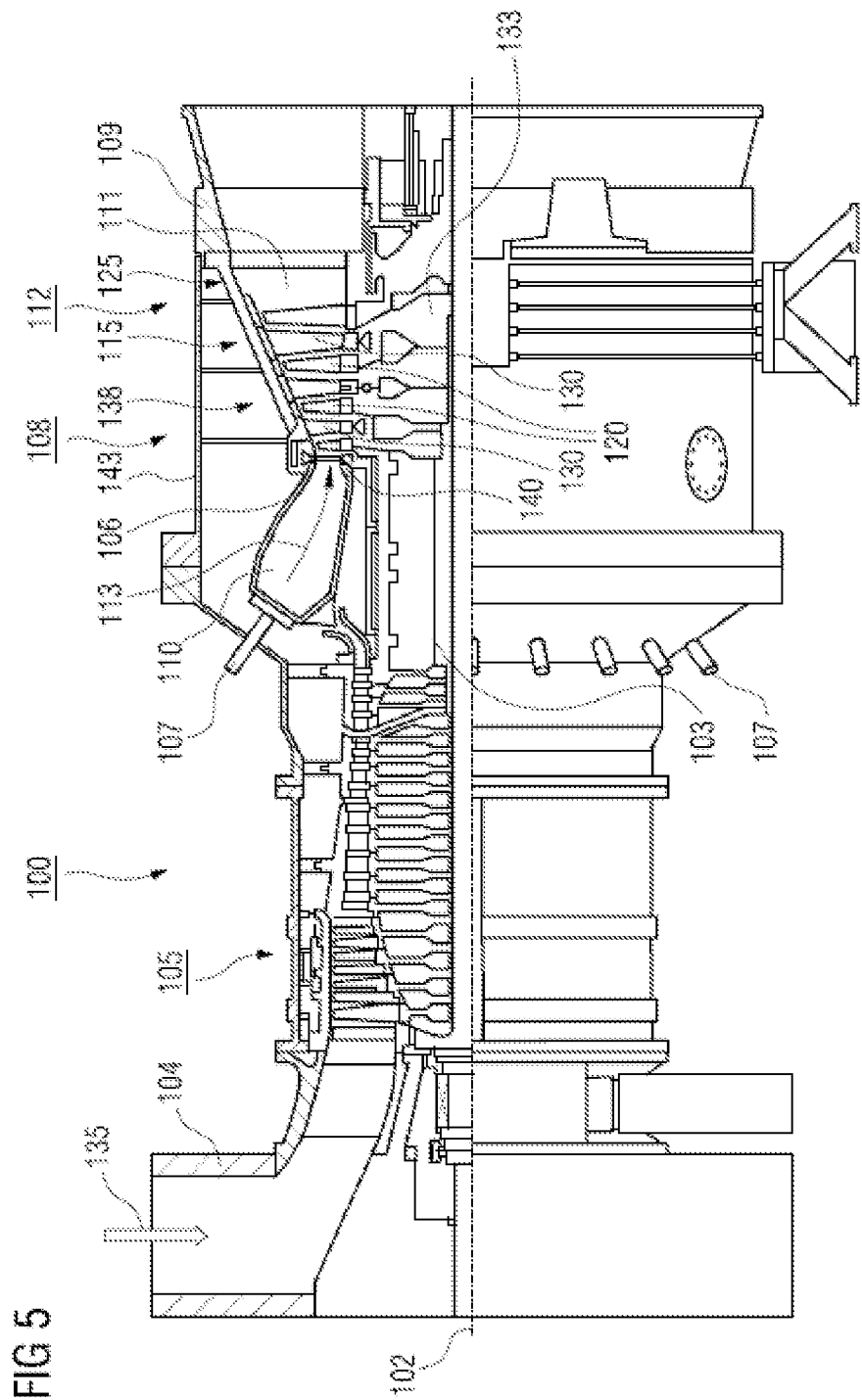
FIG. 5 shows a gas turbine.

FIG. 5 shows, by way of example, a partial longitudinal section through a gas turbine 100.

In the interior, the gas turbine 100 has a rotor 103 with a shaft which is mounted such that it can rotate about an axis of rotation 102 and is also referred to as the turbine rotor.

An intake housing 104, a compressor 105, a, for example, toroidal combustion chamber 110, in particular an annular combustion chamber, with a plurality of coaxially arranged burners 107, a turbine 108 and the exhaust-gas housing 109 follow one another along the rotor 103.

The annular combustion chamber 110 is in communication with a for example annular hot gas duct 111. There, for example four series-connected turbine stages 112 form the turbine 108.

Each turbine stage 112 is formed, for example, from two blade or vane rings. As seen in the direction of flow of a working medium 113, in the hot gas duct 111 a row of guide vanes 115 is followed by a row 125 formed from rotor blades 120.

The guide vanes 130 are secured to an inner housing 138 of a stator 143, whereas the rotor blades 120 of a row 125 are fitted to the rotor 103 for example by means of a turbine disk 133.

A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot gas duct 111 past the guide vanes 130 and the rotor blades 120. The working medium 113 expands at the rotor blades 120, imparting its momentum, so that the rotor blades 120 drive the rotor 103 and the latter drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield elements which line the annular combustion chamber 110, are subject to the highest thermal stresses.

To be able to withstand the temperatures which prevail there, they may be cooled by means of a coolant.

Substrates of the components may likewise have a directional structure, i.e. they are in single-crystal form (SX structure) or have only longitudinally oriented grains (DS structure).

By way of example, iron-based, nickel-based or cobalt-based superalloys are used as material for the components, in particular for the turbine blade or vane 120, 130 and components of the combustion chamber 110.

Superalloys of this type are known, for example, from EP 1 204 776 B1, EP 1 306 454, EP 1 319 729 A1, WO 99/67435 or WO 00/44949.

The guide vane 130 has a guide vane root (not shown here), which faces the inner housing 138 of the turbine 108, and a guide vane head which is at the opposite end from the guide vane root. The guide vane head faces the rotor 103 and is fixed to a securing ring 140 of the stator 143.

FIG. 4 shows a perspective view of a rotor blade 120 or guide vane 130 of a turbomachine, which extends along a longitudinal axis 121.

The turbomachine may be a gas turbine of an aircraft or of a power plant for generating electricity, a steam turbine or a compressor.

The blade or vane 120, 130 has, in succession along the longitudinal axis 121, a securing region 400, an adjoining blade or vane platform 403 and a main blade or vane part 406 and a blade or vane tip 415.

As a guide vane 130, the vane 130 may have a further platform (not shown) at its vane tip 415.

A blade or vane root 183, which is used to secure the rotor blades 120, 130 to a shaft or a disk (not shown), is formed in the securing region 400.

The blade or vane root 183 is designed, for example, in hammerhead form. Other configurations, such as a fir-tree or dovetail root, are possible.

The blade or vane 120, 130 has a leading edge 409 and a trailing edge 412 for a medium which flows past the main blade or vane part 406.

In the case of conventional blades or vanes 120, 130, by way of example solid metallic materials, in particular superalloys, are used in all regions 400, 403, 406 of the blade or vane 120, 130.

Superalloys of this type are known, for example, from EP 1 204 776 B1, EP 1 306 454, EP 1 319 729 A1, WO 99/67435 or WO 00/44949.

The blade or vane 120, 130 may in this case be produced by a casting process, by means of directional solidification, by a forging process, by a milling process or combinations thereof.

Workpieces with a single-crystal structure or structures are used as components for machines which, in operation, are exposed to high mechanical, thermal and/or chemical stresses.

Single-crystal workpieces of this type are produced, for example, by directional solidification from the melt. This involves casting processes in which the liquid metallic alloy solidifies to faun the single-crystal structure, i.e. the single-crystal workpiece, or solidifies directionally.

In this case, dendritic crystals are oriented along the direction of heat flow and form either a columnar crystalline grain structure (i.e. grains which run over the entire length of the workpiece and are referred to here, in accordance with the language customarily used, as directionally solidified) or a single-crystal structure, i.e. the entire workpiece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, and columnar crystal structures, which do have grain boundaries running in the longitudinal direction but do not have any transverse grain boundaries. This second form of crystalline structures is also described as directionally solidified microstructures (directionally solidified structures).

Processes of this type are known from U.S. Pat. No. 6,024,792 and EP 0 892 090 A1.

The blades or vanes 120, 130 may likewise have coatings protecting against corrosion or oxidation e.g. (MCrAlX; M is at least one element selected from the group consisting of iron (Fe), cobalt (Co), nickel (Ni), X is an active element and stands for yttrium (Y) and/or silicon and/or at least one rare earth element, or hafnium (Hf)). Alloys of this type are known from EP 0 486 489 B1, EP 0 786 017 B1, EP 0 412 397 B1 or EP 1 306 454 A1.

The density is preferably 95% of the theoretical density.

A protective aluminum oxide layer (TGO=thermally grown oxide layer) is formed on the MCrAlX layer (as an intermediate layer or as the outermost layer).

The layer preferably has a composition Co-30Ni-28Cr-8Al-0.6Y-0.7Si or Co-28Ni-24Cr-10Al-0.6Y. In addition to these cobalt-based protective coatings, it is also preferable to use nickel-based protective layers, such as Ni-10Cr-12Al-0.6Y-3Re or Ni-12Co-21Cr-11Al-0.4Y-2Re or Ni-25Co-17Cr-10Al-0.4Y-1.5Re.

It is also possible for a thermal barrier coating, which is preferably the outermost layer and consists for example of $ZrO_2$, $Y_2O_3$—$ZrO_2$, i.e. unstabilized, partially stabilized or fully stabilized by yttrium oxide and/or calcium oxide and/or magnesium oxide, to be present on the MCrAlX.

The thermal barrier coating covers the entire MCrAlX layer.

Columnar grains are produced in the thermal barrier coating by suitable coating processes, such as for example electron beam physical vapor deposition (EB-PVD).

Other coating processes are possible, for example atmospheric plasma spraying (APS), LPPS, VPS or CVD. The thermal barrier coating may include grains that are porous or have micro-cracks or macro-cracks, in order to improve the resistance to thermal shocks. The thermal barrier coating is therefore preferably more porous than the MCrAlX layer.

The blade or vane 120, 130 may be hollow or solid in form.

If the blade or vane 120, 130 is to be cooled, it is hollow and may also have film-cooling holes 418 (indicated by dashed lines).

We claim:

1. A method for adjusting the flow of a medium within a hollow component, comprising:
    providing a hollow component which in the interior includes a duct with different regions which include different cross sections of flow, a first region with a smaller cross section and a second region with a larger cross section;
    producing a first diffusion coating in the first region by a first diffusion coating process using to first coating material; and
    producing a second diffusion coating in the first region and in the second region by a second diffusion coating process, which is different from the first diffusion coating process, using a second coating material,
    wherein because of the production of the two coating processes in the first region, a greater wall thickening occurs in the first region than in the second region, whereby a thicker first layer is formed on the first region than a second layer formed on the second region,
    wherein different coating materials are used for the diffusion coating processes, and
    wherein a second coating material is applied on top of a first coating material.

2. The method as claimed in claim 1, wherein aluminizing processes are used for the diffusion coatings processes.

3. The method as claimed in claim 1, wherein Ni2Al3 is used as an aluminum source for the first diffusion coating process.

4. The method as claimed in claim 1, wherein which NiAl is used as an aluminum source for the second diffusion coating process.

5. The method as claimed in claim 1, wherein the first and second diffusion processes are carried out in succession.

6. The method as claimed in claim 2, wherein the region which was aluminized first is aluminized again.

7. The method as claimed in claim 1,
    wherein the coating materials have different activation energies, and
    wherein firstly a lower temperature is used for one coating material and then a higher temperature is used for the other coating material.

* * * * *